US010890814B2

(12) United States Patent
Hsu

(10) Patent No.: US 10,890,814 B2
(45) Date of Patent: Jan. 12, 2021

(54) DISPLAY HAVING DUMMY SUB-PIXELS WITH DUMMY COLOR RESISTS

(71) Applicant: AU OPTRONICS CORPORATION, Hsin-Chu (TW)

(72) Inventor: Chung-Ping Hsu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/188,623

(22) Filed: Nov. 13, 2018

(65) Prior Publication Data
US 2019/0163005 A1    May 30, 2019

(30) Foreign Application Priority Data

Nov. 29, 2017  (TW) .............................. 106141501 A

(51) Int. Cl.
| | |
|---|---|
| *G02F 1/1345* | (2006.01) |
| *G02F 1/1368* | (2006.01) |
| *G02F 1/1362* | (2006.01) |
| *H01L 27/12* | (2006.01) |
| *H01L 27/32* | (2006.01) |
| *G02F 1/1333* | (2006.01) |

(52) U.S. Cl.
CPC ........ *G02F 1/13454* (2013.01); *G02F 1/1368* (2013.01); *G02F 1/136286* (2013.01); *H01L 27/124* (2013.01); *H01L 27/322* (2013.01); *H01L 27/3223* (2013.01); *G02F 2001/133388* (2013.01); *G02F 2001/136222* (2013.01); *H01L 27/3213* (2013.01); *H01L 27/3276* (2013.01); *H01L 27/3288* (2013.01)

(58) Field of Classification Search
None
See application file for complete search history.

(56) References Cited

U.S. PATENT DOCUMENTS

| | | | |
|---|---|---|---|
| 2005/0140305 A1* | 6/2005 | Kim | .................... H01L 27/3223 |
| | | | 315/169.3 |
| 2009/0109134 A1* | 4/2009 | Kim | .................. G02F 1/136204 |
| | | | 345/55 |
| 2010/0079710 A1* | 4/2010 | Yang | .................... G02F 1/13392 |
| | | | 349/106 |
| 2018/0031890 A1* | 2/2018 | Jung | .................. G02F 1/134309 |

FOREIGN PATENT DOCUMENTS

| | | |
|---|---|---|
| CN | 104536229 A | 4/2015 |
| CN | 106707392 A | 5/2017 |

* cited by examiner

*Primary Examiner* — Kevin Parendo
(74) *Attorney, Agent, or Firm* — WPAT, PC

(57) ABSTRACT

A pixel structure substrate includes a first substrate, a plurality of first, second, and third color resists, at least two dummy color resists, and at least one transfer electrode. The first substrate has a display area and a periphery area, where the periphery area has a plurality of dummy pixels, each dummy pixel includes at least three dummy sub-pixels, and the display area has a plurality of sub-pixel units. The first, the second, and the third color resists are respectively disposed on at least some of the sub-pixel units. The at least two dummy color resists are disposed in a first one and a second one in the three dummy sub-pixels included in at least one dummy pixel, and a third one does not include the dummy color resists and the first, the second, and the third color resists. The at least one transfer electrode is disposed in the third one in the three dummy sub-pixels included in the at least one dummy pixel.

10 Claims, 15 Drawing Sheets

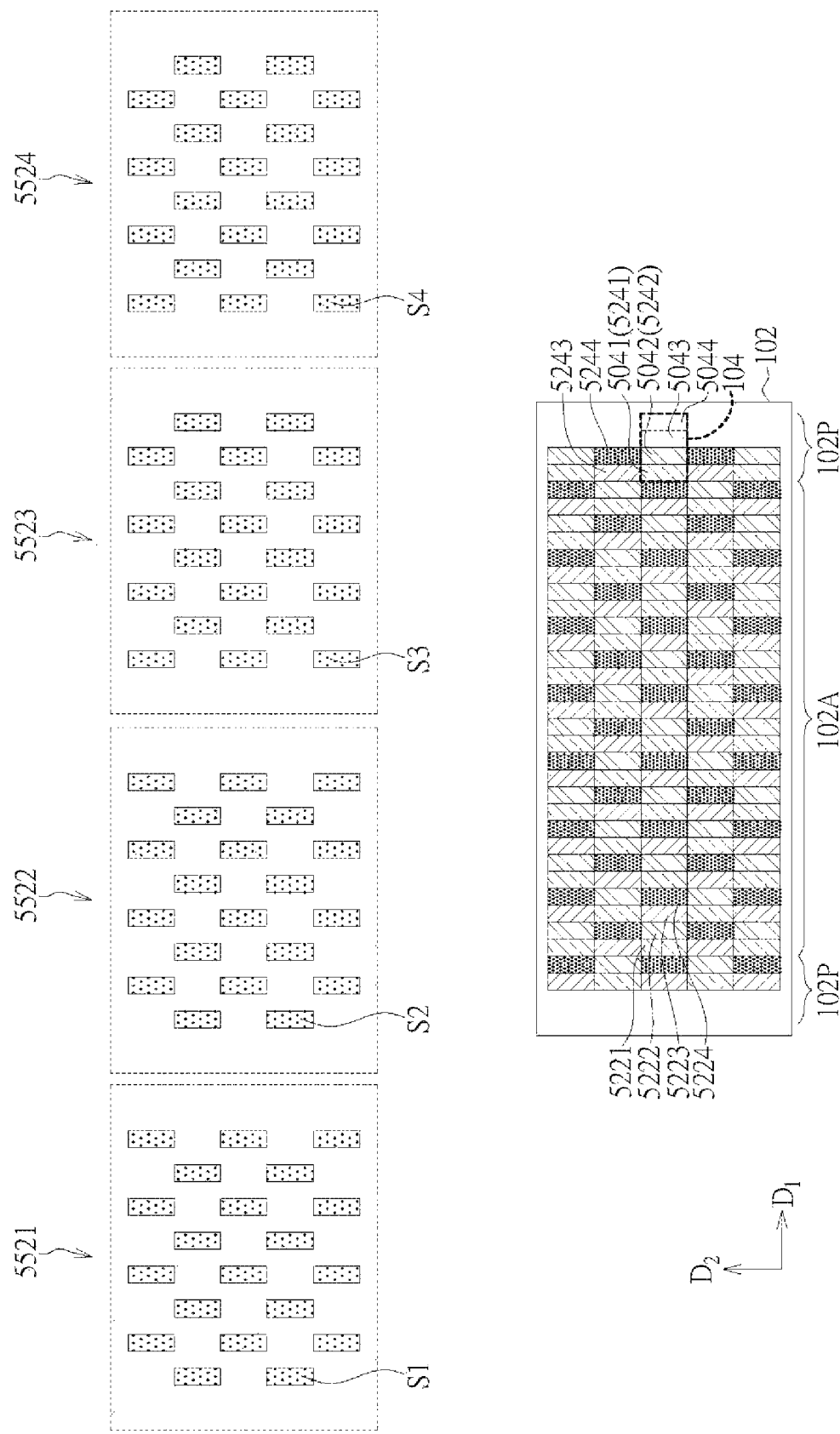

DISPLAY HAVING DUMMY SUB-PIXELS WITH DUMMY COLOR RESISTS

BACKGROUND

Technical Field

The present disclosure relates to a substrate and a display panel thereof, and in particular, to a pixel structure substrate and a display panel thereof.

Related Art

Currently, display panels are popular with the public and are widely applied to various fields, such as mobile phones, digital display boards, or other proper fields. However, how to implement a relatively large viewable area of a display panel is one of the directions towards which people are working hard.

SUMMARY

One of the objectives of the present disclosure is to provide relative positions for disposing a dummy color resist and a peripheral drive circuit, so as to implement a narrow frame.

According to some embodiments, the present disclosure provides a pixel structure substrate. Such pixel structure substrate includes a first substrate, a plurality of first, second, and third color resists, a peripheral drive circuit, at least two dummy color resists, and at least one transfer electrode. The first substrate has a display area and a periphery area. The periphery area is located on at least one side of the display area. The periphery area has a plurality of dummy pixels. Each dummy pixel includes at least three dummy sub-pixels. The display area has a plurality of sub-pixel units. Each sub-pixel unit includes at least one active element and at least one pixel electrode, where the pixel electrode is electrically connected to the active element, and the active element is electrically connected to at least one corresponding signal line. The first, the second, and the third color resists are respectively disposed on at least some of the sub-pixel units. The peripheral drive circuit is disposed on at least a part of the periphery area. The peripheral drive circuit includes at least one drive element. The at least two dummy color resists are disposed in a first and a second dummy sub-pixels in the at least three dummy sub-pixels in at least one of the dummy pixels, where a third dummy sub-pixel in the at least three dummy sub-pixels in the at least one of the dummy pixels does not include the dummy color resists and the first, the second, and the third color resists, and the at least two dummy color resists are in different colors. The at least one transfer electrode is disposed in the third dummy sub-pixel in the at least three dummy sub-pixels in the at least one of the dummy pixels, where the at least one drive element of the peripheral drive circuit is electrically connected to the at least one signal line by using the at least one transfer electrode.

According to some embodiments, the present disclosure provides a display panel. The display panel includes the pixel structure substrate as described above, a second substrate, and a display medium. The second substrate is disposed corresponding to the first substrate. The display medium is disposed between the first substrate and the second substrate.

To better understand the foregoing and other aspects of the present disclosure, embodiments are particularly listed below with reference to the accompanying drawings, which are described in detail below.

BRIEF DESCRIPTION OF THE DRAWINGS

FIG. 5A is a schematic diagram of a mask configuration according to still another embodiment;

DETAILED DESCRIPTION

Figure 1A:
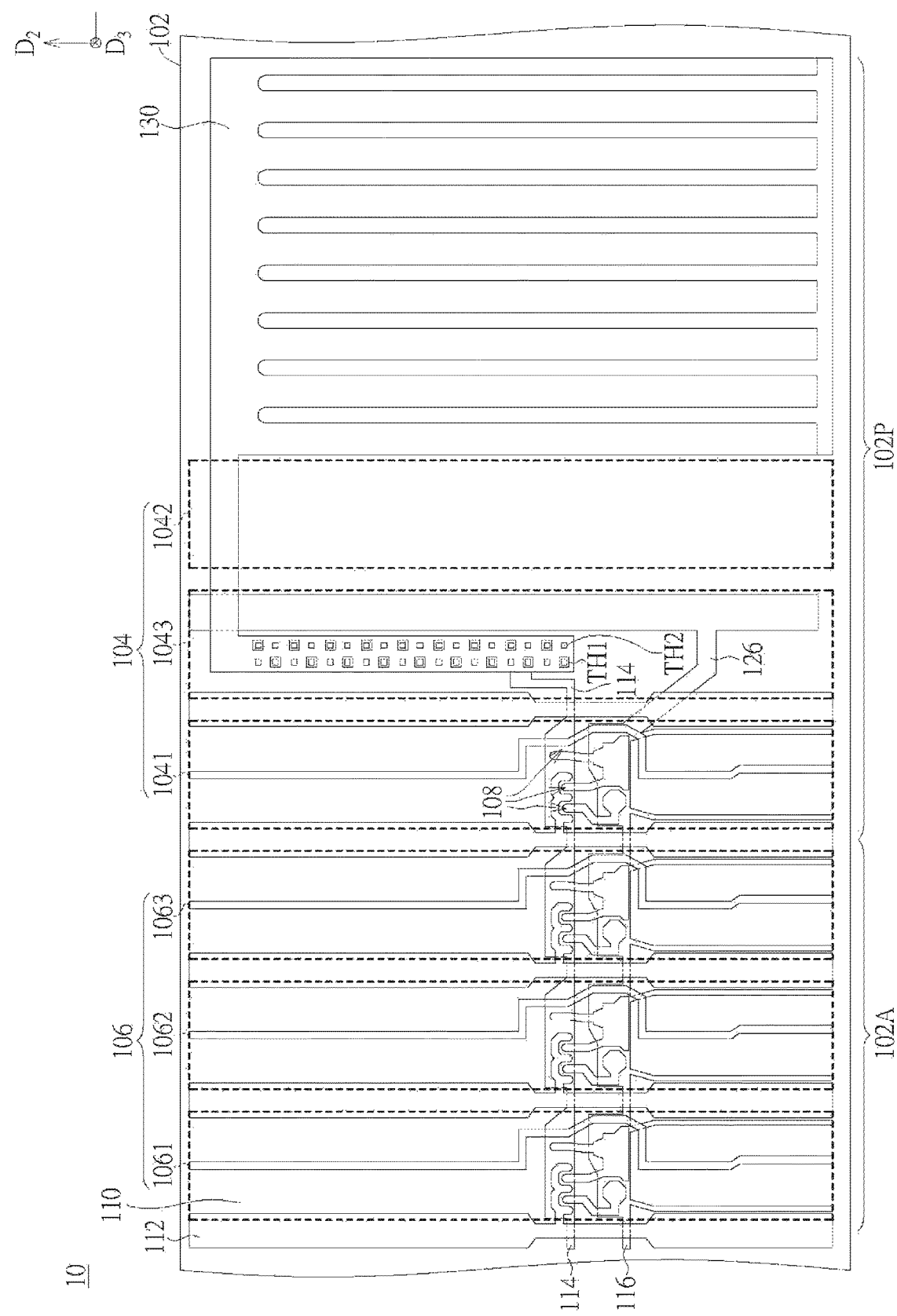
FIG. 1A is a schematic diagram of a pixel structure substrate of some elements according to an embodiment.

A pixel structure substrate according to the embodiments is described in detail below with reference to the accompanying drawings. Elements in the figures may not be drawn in proportion. Moreover, some elements may be omitted in the figures. Elements and features in an embodiment may be combined with elements and features in another embodiment, but no examples are further made to this. After understanding the embodiments of the content of this disclosure, any person of ordinary skill in the art may make some variations and modifications according to the teachings of the content of this disclosure, without departing from the scope and spirit of the disclosure.

The terms "first", "second", "third" and the like used herein may be used to describe various elements, components, areas, layers, and/or parts. However, these elements, components, areas, and/or parts should not be limited by these terms. These terms are merely used to distinguish one element, component, area, layer, or part from another element, component, area, layer, or part. Therefore, the "first element", "component", "area", "layer", or "part" discussed below may be referred to as a second element, component, area, layer, or part, without departing from the teachings of the present disclosure.

In the accompanying drawings, for clarity, thicknesses of a layer, a film, a panel, an area, and the like are enlarged. In the entire specification, a same reference numeral represents a same element. It should be understood that when an element such as a layer, a film, an area, or a substrate is referred to as being "on" another element or "connected" to another element, the element may be directly on the another element, or may be connected to the another element, or an intermediate element may exist. On the contrary, when an element is referred to as being "directly on another element" or "directly connected to" another element, there are no intermediate elements. As used herein, "connection" may refer to a physical connection and/or an electrical connection. Moreover, "electrical connection" or "couple" may be that there are other elements between two elements.

"About", "approximately", or "substantially" used herein includes a value and an average value within an acceptable deviation range of particular values determined by a person of ordinary skill in the art. Discussed measurements and a particular quantity (that is, a limitation of a measurement system) of errors related to the measurements are considered. For example, "about" may indicate that it is within one or more standard deviations of the value, or within ±30%, ±20%, ±10%, or ±5%. Further, "about", "approximately", or "substantially" used herein may indicate that a relatively acceptable deviation range or a standard deviation may be selected according to an optical property, an etching property, or other properties, without adapting a standard deviation to all properties.

Terms such as "comprise", "include", "have", and "contain" used herein are all open terms, and mean including but not limited to. The term "and/or" used herein includes any one of or all combinations of objects.

The terms used herein are merely for describing specific embodiments, but are not intended to limit the present disclosure. As used herein, unless clearly indicated in the content, "a", "one", and "the" in a singular form are intended to include a plural form, and include "at least one". "Or" represents "and/or". As used herein, the term "and/or" includes any and all combinations of one or more related listed items. It should also be understood that when used in this specification, the term "include" and/or "comprise" specifies existence of the features, areas, entities, steps, operations, elements, and/or components, but does not exclude the existence or addition of one or more other features, areas, integrals, steps, operations, elements, components, and/or combinations thereof.

In addition, relative terms such as "lower", "bottom", "upper", or "top" may be used herein to describe a relationship between an element and another element, as shown in the figures. It should be understood that the relative terms are intended to include different orientations of apparatuses in addition to the orientations shown in the figures. For example, if an apparatus in a figure is turned over, elements described as being on "lower" sides of other elements would then be reversed to be on "upper" sides of the other elements. Therefore, the exemplary term "below" may include orientations of "below" and "above", and this depends on a particular orientation of the accompanying drawing. Similarly, if an apparatus in a figure is turned over, elements described as being "below" other elements would then be reversed to be "above" the other elements. Therefore, the exemplary term "below" or "under" may include orientations of upper and below.

Unless otherwise defined, all terms (including technical and scientific terms) used herein have same meanings that are generally understood by a person of ordinary skill in the art. It should be further understood that those terms defined in dictionaries that are usually used should be construed to have meanings that are the same as meanings of these terms in the related art and the context of the present disclosure, and should not be construed to have ideal or excessively formal meanings, unless explicitly defined herein.

Figure 1B:
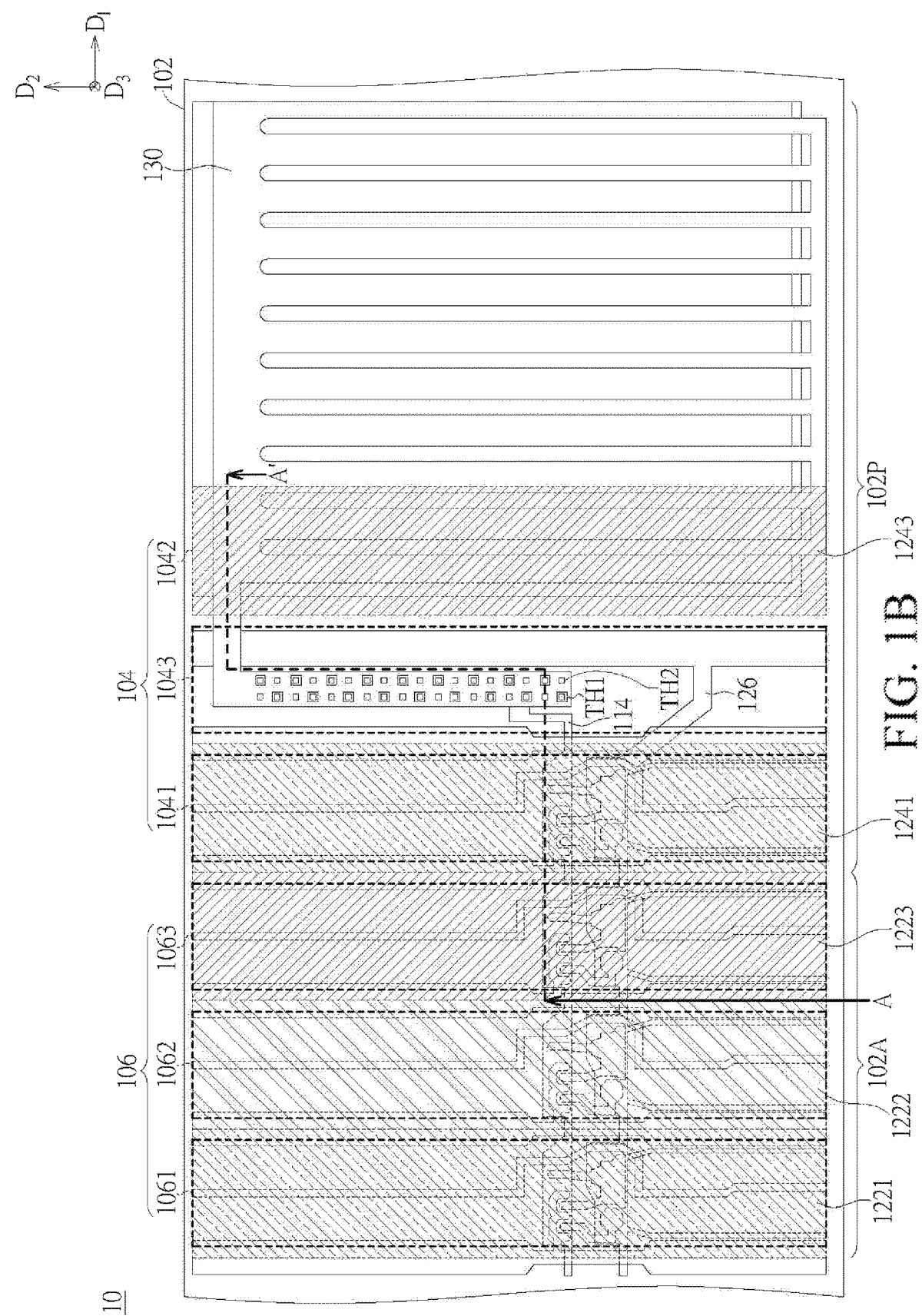
FIG. 1B is a schematic diagram of a configuration in which a color resist and a dummy color resist are stacked in FIG. 1A according to an embodiment.
Figure 1C:
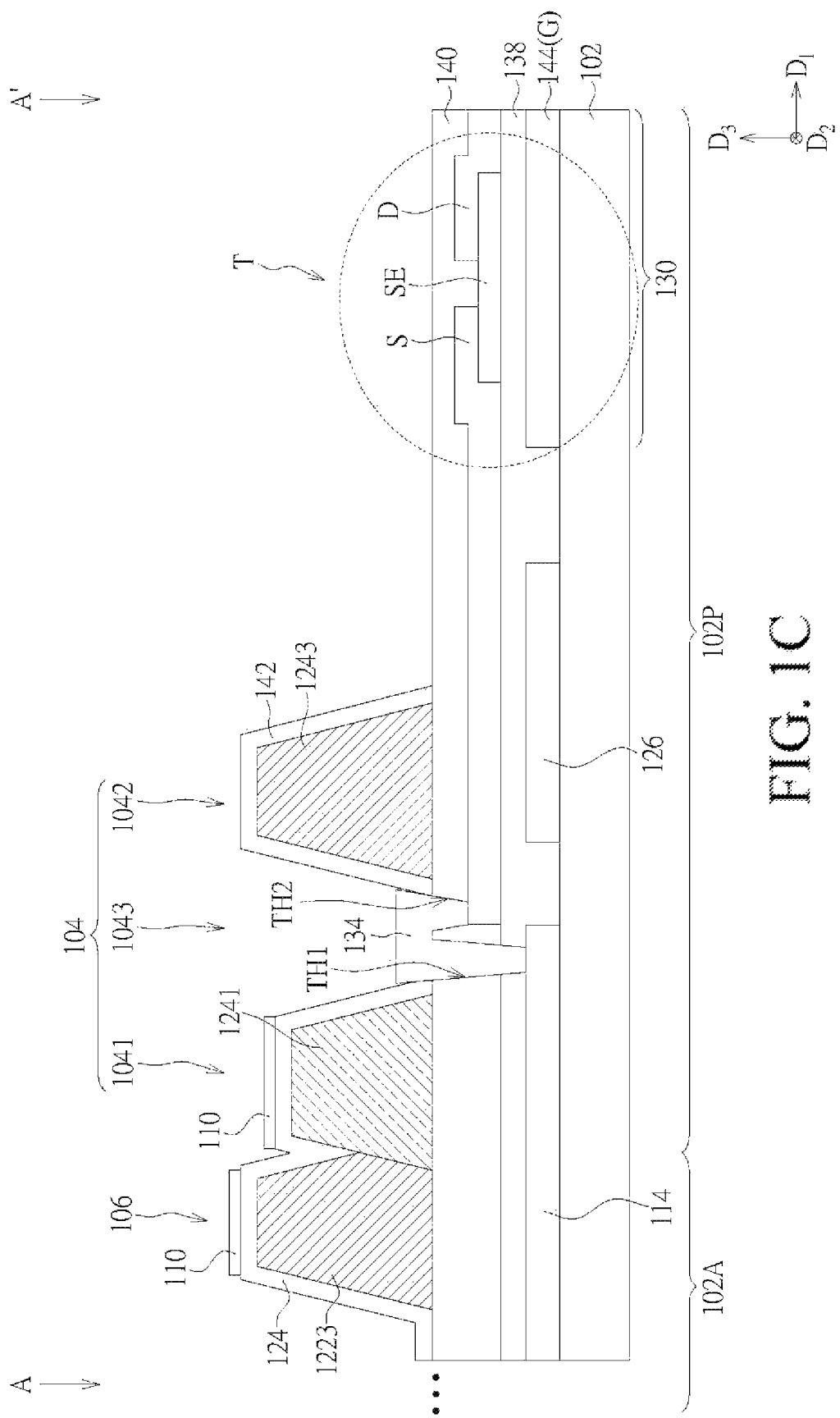
FIG. 1C is a cross-sectional schematic view along a line A-A' in FIG. 1B.

Referring to FIG. 1A to FIG. 1C, FIG. 1A to FIG. 1C show an exemplary pixel structure substrate 10 according to an embodiment. FIG. 1A is a schematic diagram of a pixel structure substrate of some elements according to an embodiment; FIG. 1B is a schematic diagram of a configuration in which a color resist and a dummy color resist are stacked in FIG. 1A according to an embodiment; and FIG. 1C is a cross-sectional schematic view along a line A-A' in FIG. 1B.

As shown in FIG. 1A to FIG. 1C, the pixel structure substrate 10 includes a first substrate 102. A material of the first substrate 102 may be, but is not limited to, an organic material such as glass, quartz, ceramic, metal, alloy or polyimide (PI), polyethylene terephthalate (PET), polyethylene naphthalate (PEN), or polyamide (PA), or may be another proper material, or may be a combination of at least two of the foregoing materials. The first substrate 102 has a display area 102A and a periphery area 102P. The display area 102A is configured to display an image, and the periphery area 102P is a non-display area and is configured to dispose a peripheral drive circuit. The periphery area 102P is located on at least one side of the display area 102A. For example, the periphery area 102P may be located on one side of the display area 102A, or may be located on two opposite sides of the display area 102A, or may surround the display area 102A, but is not limited thereto. The periphery area 102P has a plurality of dummy pixels 104, and at least one of the plurality of dummy pixels 104 (preferably, each dummy pixel 104) includes at least three dummy sub-pixels 1041, 1042, and 1043. The display area 102A has a plurality of sub-pixel units 106, where at least one of the plurality of sub-pixel units 106 includes, for example, at least three sub-pixel units 1061, 1062, and 1063. In an embodiment, the sub-pixel units 1061, 1062, and 1063 are configured to emit lights in different colors.

As shown in FIG. 1A, each of the sub-pixel units 1061, 1062, and 1063 includes at least one active element 108 and at least one pixel electrode 110. The pixel electrode 110 is electrically connected to the active element 108, and the active element 108 is electrically connected to at least one corresponding signal line (for example, at least one data line 112, at least one scan line 114, or another proper line such as at least one reference electrode line 116). Configurations of relative positions of the active element 108, the pixel electrode 110, and signal lines 112, 114, 116 . . . etc. in the sub-pixel unit 106 shown in FIG. 1A are only examples, and other aspects of the sub-pixel unit 106 also need to be included in the present disclosure. In some embodiments, the signal line includes at least one of the data line 112, the scan line 114, and the reference electrode line 116. Each sub-pixel unit 106 shown in FIG. 1A preferably includes a main pixel and a sub pixel and has three active elements 108, but the present disclosure is not limited thereto. In another embodiment, the sub-pixel unit 106 may have only one active element 108 and/or each sub-pixel unit 106 may include only one sub pixel. In some embodiments, the active element 108 is, for example, a bottom-gate thin film transistor (bottom-gate TFT), for example, a gate is located below a semiconductor layer, but the present disclosure is not limited thereto. In another embodiment, the active element 108 may be a top-gate TFT, for example, a gate is located above the semiconductor layer, or may be another TFT of a proper type.

Referring to FIG. 1B and FIG. 1C again, the pixel structure substrate 10 may include a plurality of first color resists 1221, second color resists 1222, and third color resists 1223 that are respectively disposed on at least some of the pixel units 106. For example, the first color resist 1221, the second color resist 1222, and the third color resist 1223 may be respectively disposed on some of the pixel units 106, for example, respectively disposed on the sub-pixel units 1061, 1062, and 1063 as shown in FIG. 1B. The sub-pixel units 1061, 1062, and 1063 are in neighboring relationships. In another embodiment, the arrangement of the sub-pixel units 1061, 1062, and 1063 may be changed according to a requirement, for example, being arranged in a staggered manner (or namely alternatively manner), in a triangular manner (or namely delta manner), or in another proper manner. In an embodiment, the first color resist 1221, the second color resist 1222, and the third color resist 1223 are preferably in different colors, but are not limited thereto.

The dummy pixel 104 includes a first dummy sub-pixel 1041 (that is, a first dummy pixel in the dummy sub-pixels), a second dummy sub-pixel 1042 (that is, a second dummy pixel in the dummy sub-pixels), and a third dummy sub-pixel 1043 (that is, a third dummy pixel in the dummy sub-pixels), and the dummy sub-pixels 1041, 1042, and 1043 are adjacent to each other. In this embodiment, the third dummy sub-pixel 1043 is located between the first dummy sub-pixel 1041 and the second dummy sub-pixel 1042. The pixel structure substrate 10 includes at least two dummy color resists 1241 and 1243. For example, the dummy color resists 1241 and 1243 are respectively disposed in the first dummy sub-pixel 1041 and the second dummy sub-pixel 1042. In this embodiment, the first dummy sub-pixel 1041 is adjacent to the sub-pixel unit 1063. For example, there are no other dummy sub-pixels or sub-pixel units between the first dummy sub-pixel 1041 and the sub-pixel unit 1063. The third dummy sub-pixel 1043 in the dummy sub-pixels included in at least one of the dummy pixels 104 (preferably, a plurality of dummy pixels) does not include the dummy color resists 1241 and 1243, the first color resist 1221, the second color resist 1222, and the third color resist 1223. In other words, the third dummy sub-pixel 1043 has no color resists. The dummy color resists 1241 and 1243 are preferably in different colors. For example, color configurations of the color resists 1221, 1222, and 1223 and the dummy color resists 1241 and 1243 may be a color combination of red, green, and blue (RGB), red, green, blue, and white (RGBW), or red, yellow, green, and blue (RYGB) that is suitable for the display panel, but the present disclosure is not limited thereto.

As shown in FIG. 1A to FIG. 1C, the pixel structure substrate 10 includes a peripheral drive circuit 130. The peripheral drive circuit 130 forms a drive circuit on at least a part of the periphery area 102P of the substrate 102 to replace a driver integrated circuit (IC) that occupies a large area, so as to decrease the frame width of the display panel. It may be considered that the peripheral drive circuit 130 occupies at least a part of the area of the periphery area 102P. In an embodiment of the present disclosure, for the driver circuit, a gate driver on array (GOA) is used as an example, and may replace a gate driver IC that occupies a large area, so as to decrease the frame width of the display panel. It may be considered that the peripheral drive circuit 130 occupies at least a part of the area of the periphery area 102P, but the present disclosure is not limited thereto. The peripheral drive circuit 130 includes at least a drive element T and a peripheral line (for example, a reference electrode bus-line 126 or a line transmitting another signal), and is configured to drive the sub-pixel units 1061, 1062, and 1063 of the display area 102A. The peripheral drive circuit 130 is simplified in FIG. 1A and FIG. 1B, and a relative position of the peripheral drive circuit 130 on the substrate 102 is represented only by using line segments.

As shown in FIG. 1B and FIG. 1C, the peripheral drive circuit 130 drives the sub-pixel units 1061, 1062, and 1063 of the display area 102A by using the drive element T. The drive element T includes, for example, a gate G, a source S, a drain D, and a semiconductor layer SE, and is, for example, a bottom-gate TFT. That is, the gate G is located below the semiconductor layer SE, but the present disclosure is not limited thereto. In another embodiment, the drive element T may be a top-gate TFT, for example, the gate G is located above the semiconductor layer SE, or may be another TFT of a proper type. The active element 108 of the display area 120A and the semiconductor layer of the drive element T of the peripheral drive circuit 130 may be a single layer or multiple layers, and materials thereof may include amorphous silicon, nanocrystalline silicon, microcrystalline silicon, polysilicon, monocrystalline, an oxide semiconductor material, a carbon nanotube/nanorod, an organic semiconductor material, or another proper semiconductor material. Structures of the active element 108 of the display area 120A and the drive element T of the peripheral drive circuit 130 may be substantially the same or different, and the materials of the active element 108 of the display area 120A and the semiconductor layer of the drive element T of the peripheral drive circuit 130 may be substantially the same or different. The at least one drive element T of the peripheral drive circuit 130 is electrically connected to the at least one signal line (for example, at least one of the data line 112 and the scan line 114) by using at least one transfer electrode 134. The source S/drain D of the drive element T is electrically connected to the at least one signal line (for example, the scan line 114) by using (or namely via) the transfer electrode 134, but this connection manner is not intended to limit the present disclosure. In addition, as shown in an exemplary configuration in FIG. 1C, the peripheral line (for example, the reference electrode bus-line 126) may be located between the peripheral drive circuit 130 and the at least one transfer electrode 134. The peripheral line (for example, the reference electrode bus-line 126) may also be electrically connected to the at least one signal line (for example, the reference electrode line 116) of the pixel unit 106, where the at least one signal line (for example, the reference electrode line 116) has a reference potential or a floating signal.

In some embodiments, the at least one transfer electrode 134 may also be referred to as a bridge element that may be connected to different conductive layers (for example, the signal line 112/114) by using through holes TH1 and TH2 corresponding to one or more insulation layers 138 and 140. The signal lines 114 and 116 may be considered as a first conductive layer, and the signal line 112 may be considered as a second conductive layer. In some embodiments, the pixel electrode 110 and the at least one transfer electrode 134 are conductive layers at a same layer (for example, a third conductive layer), but are not limited thereto. In another embodiment, the pixel electrode 110 and the at least one transfer electrode 134 are conductive layers at different layers. For example, the pixel electrode 110 may be formed by the third conductive layer, and the at least one transfer electrode 134 is formed by a conductive layer except the third conductive layer, for example, the first conductive layer, the second conductive layer, or another additional conductive layer. The at least one transfer electrode 134 may be of a single-layer structure or a multilayer structure, and a material thereof includes a reflective material (for example, molybdenum, copper, aluminum, titanium, gold, silver, alloy, or another proper material), a transparent material (for example, an indium tin oxide, an indium zinc oxide, an indium gallium oxide, an indium gallium zinc oxide, a zinc oxide, a carbon nanotube, metal or an alloy having a thickness less than 60 angstroms, or another proper material), or another proper material.

In this embodiment, the first dummy sub-pixel 1041 may be directly adjacent to the third color resist 1223 of the display area 102A, so as to avoid a situation of an abnormal exposure or an uneven film of an element (for example, the pixel electrode 110) formed after a color resist because the element formed after the color resist has an excessive drop height (which may reach, for example, approximately 3 micrometers) at a border of the display area 102A adjacent to the periphery area 102P. Configurations of the color resist and the dummy color resist are further described in the following paragraphs. FIG. 1B and FIG. 1C only exemplarily provide a part of a configuration, and the present disclosure is not limited thereto.

Figure 2A:
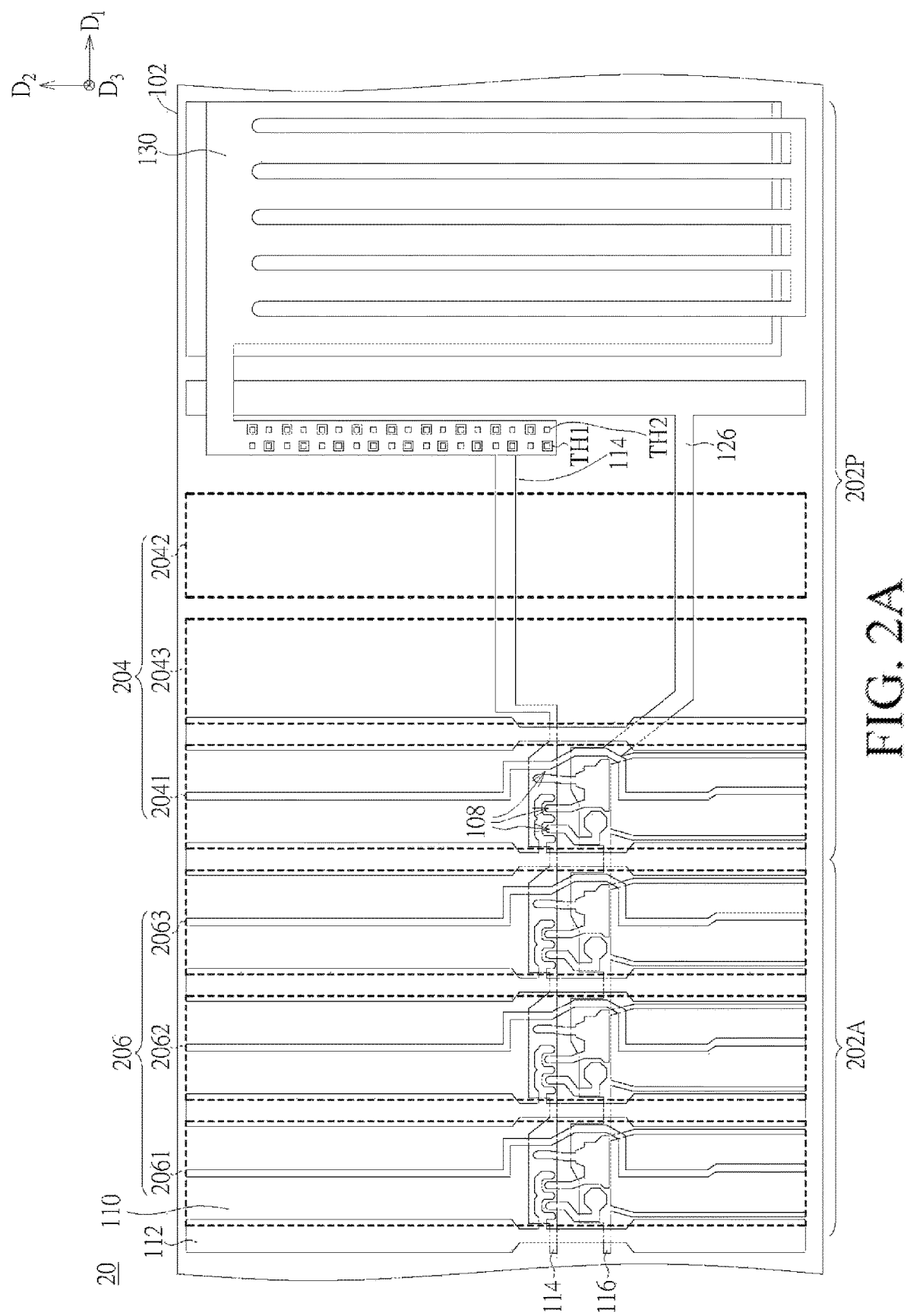
FIG. 2A is a schematic diagram of a pixel structure substrate of some elements according to a comparative embodiment.
Figure 2B:
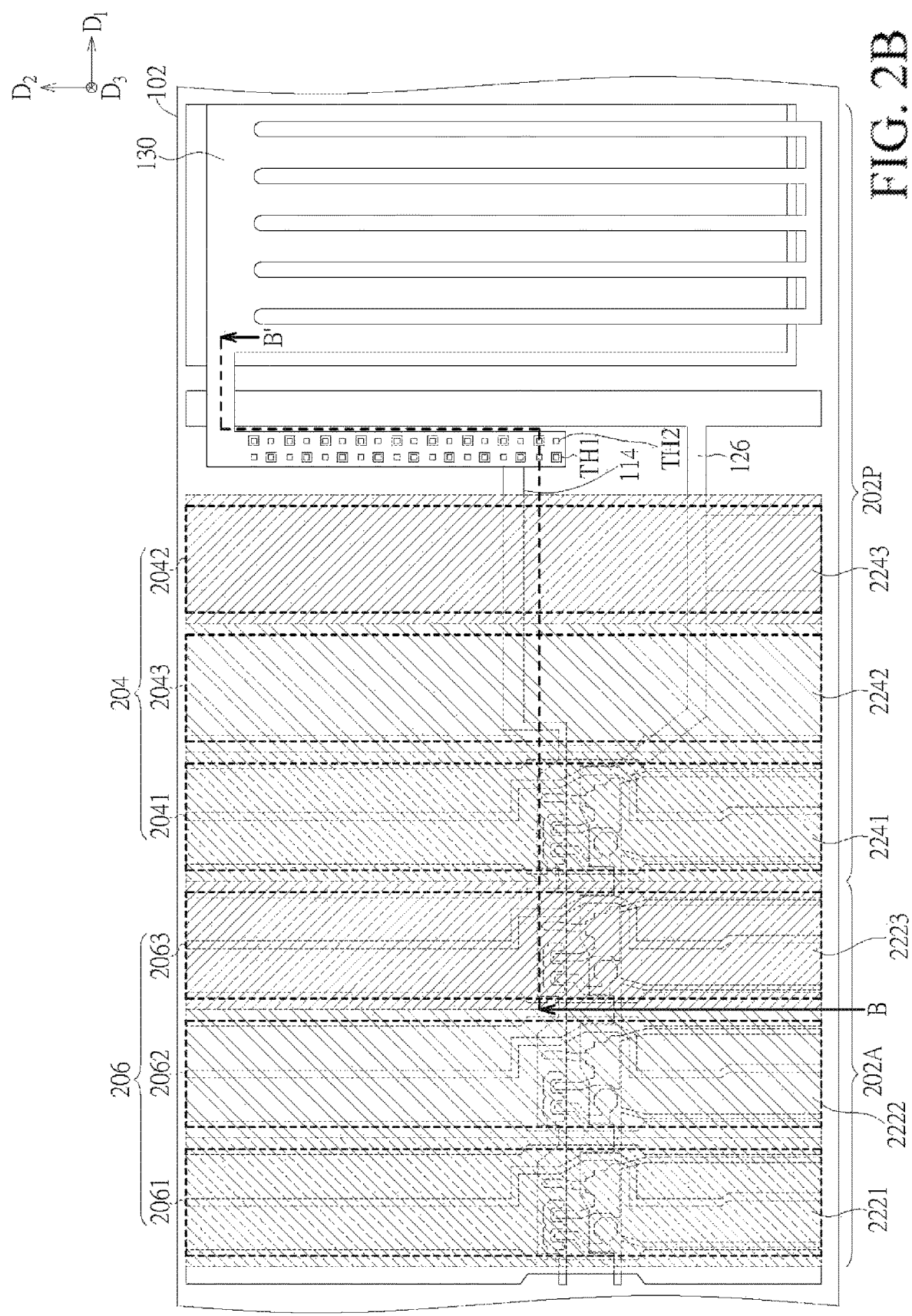
FIG. 2B is a schematic diagram of a configuration in which a color resist and a dummy color resist are stacked in FIG. 2A according to a comparative embodiment.
Figure 2C:
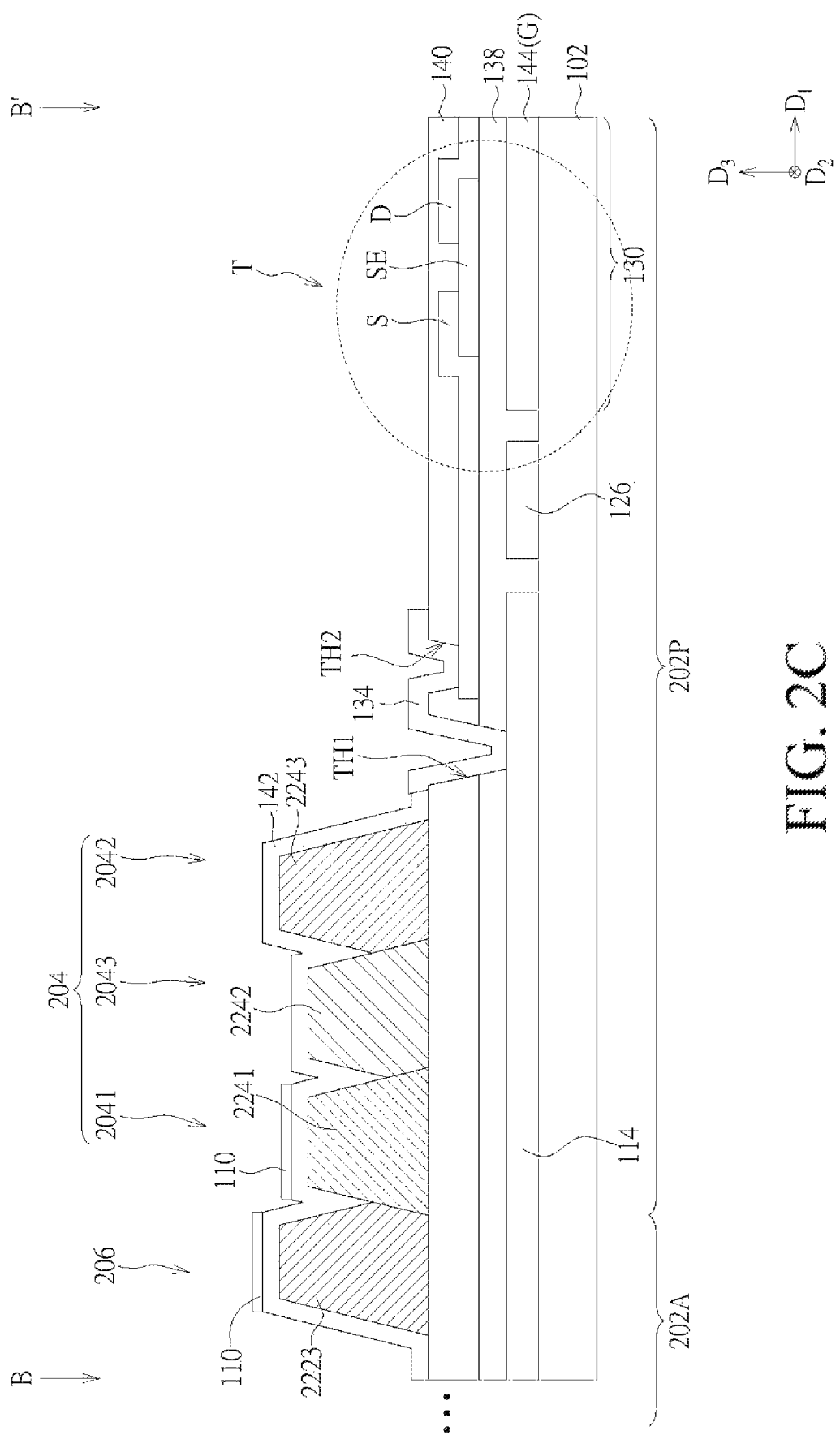
FIG. 2C is a cross-sectional schematic view along a line B-B' in FIG. 2B.

FIG. 2A to FIG. 2C show a pixel structure substrate 20 according to a comparative embodiment, and FIG. 2A to FIG. 2C respectively correspond to FIG. 1A to FIG. 1C. To distinguish differences between the pixel structure substrate 20 and the pixel structure substrate 10 more clearly, some elements in FIG. 2A to FIG. 2C still use the symbols the same as those of the elements in FIG. 1A to FIG. 1C, these elements are substantially the same elements, and relevant descriptions are omitted herein. The pixel structure substrate 20 has a plurality of pixel units 206 in a display area 202A. The pixel unit 206 includes at least three sub-pixel units 2061, 2062, and 2063 that are respectively provided with a first color resist 2221, a second color resist 2222, and a third color resist 2223. The first color resist 2221, the second color resist 2222, and the third color resist 2223 are substantially the same as the first color resist 1221, the second color resist 1222, and the third color resist 1223 stated above.

A periphery area 202P of the pixel structure substrate 20 has a plurality of dummy pixels 204, and at least one of the dummy pixels 204 (preferably, each dummy pixel) may also include at least three dummy sub-pixels (2041, 2042, and 2043). A first dummy sub-pixel 2041 in the dummy sub-pixels (that is, the first dummy sub-pixel 2041) includes a dummy color resist 2241. A structure configuration below the dummy color resist 2241 is similar to a structure configuration of the first dummy sub-pixel 1041 in the dummy sub-pixels of the pixel structure substrate 10 that is below the dummy color resist 1241. A second dummy sub-pixel 2042 in the dummy sub-pixels (that is, the second dummy sub-pixel 2042) includes a dummy color resist 2243.

As shown in FIG. 2A to FIG. 2C, for the manufacturing uniformity of elements in the display area 202A, a dummy element such as the dummy pixel 204 may be configured at a position at which the periphery area 202P is adjacent to the display area 202A. The dummy element (for example, the dummy pixel) may be designed to be substantially the same as a corresponding element in the display area, but the present disclosure is not limited thereto. In this way, optical or electrical detection, or another design requirement may be performed on the dummy element (for example, the dummy pixel). However, a relatively wide frame of a display is easily caused if the dummy element (for example, the dummy pixel) is disposed.

Therefore, as shown in FIG. 2A to FIG. 2C, the pixel structure substrate 20 differs from the pixel structure substrate 10 in that the third dummy sub-pixel 2043 in the dummy sub-pixels of the pixel structure substrate 20 has a dummy color resist 2242. Because the dummy color resist 2242 is disposed, elements such as the transfer electrode 134 cannot be configured for the third dummy sub-pixel 2043 (that is, the third dummy sub-pixel 2043) in the dummy sub-pixels, and these elements still need to be disposed outside the dummy pixel 204. Therefore, the periphery area 202P needs to occupy an area larger than that of the periphery area 102P, and consequently the pixel structure substrate 20 and an apparatus using the same need to have relatively large space. Compared with the sizes of the pixel structure substrate 20 in such configuration and the device using the same and/or the periphery area, the sizes of the pixel structure substrate 10 according to the embodiment in FIG. 1A to FIG. 1C and an apparatus using the same and/or the periphery area may be further decreased.

Figure 3A:
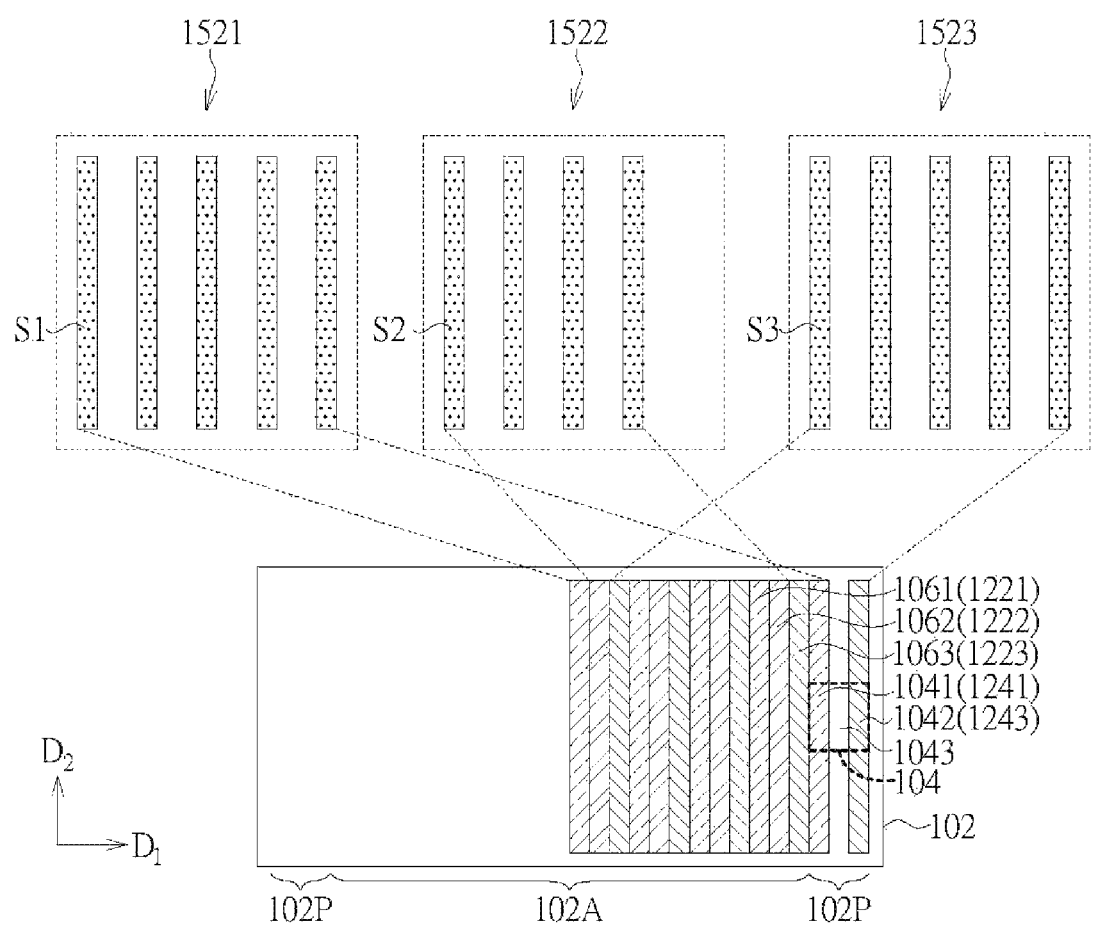
FIG. 3A is a schematic diagram showing that a part of the configuration of the color resist and the dummy color resist in FIG. 1B is configured by using a corresponding photomask.
Figure 3B:
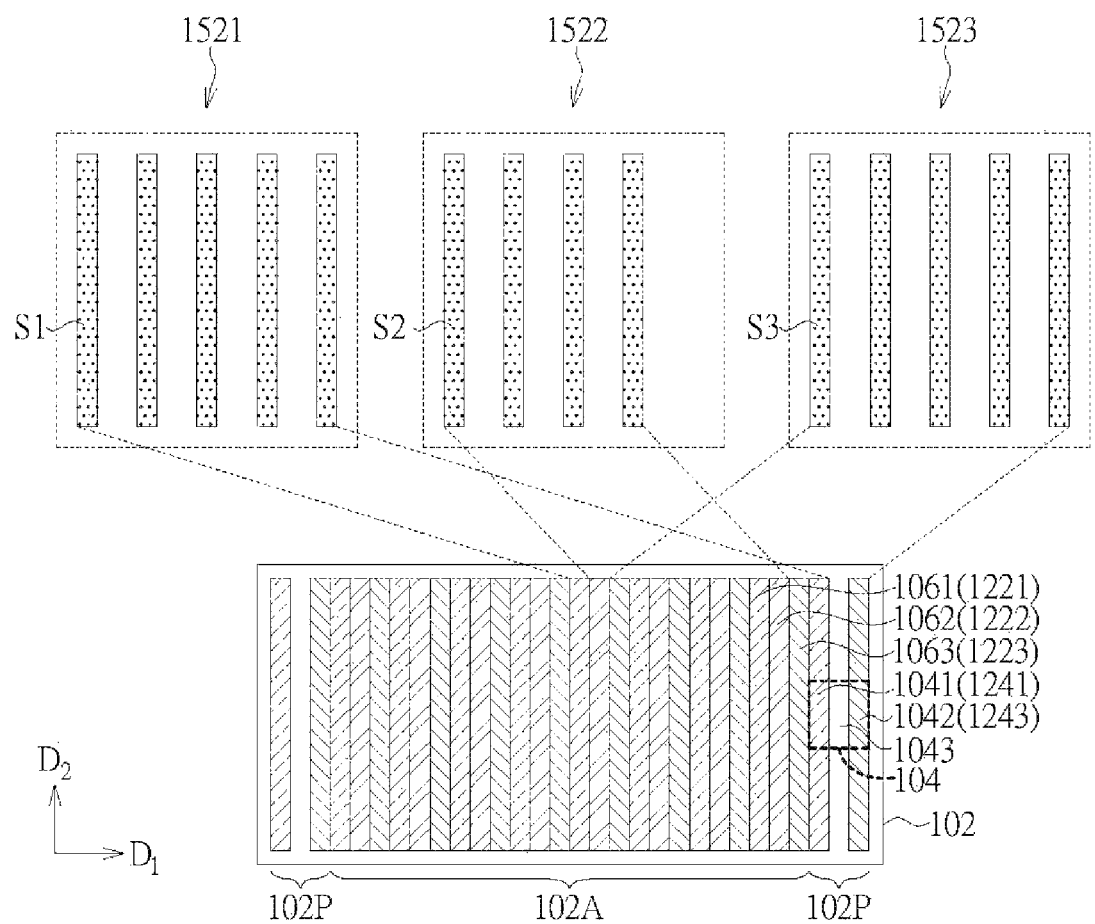
FIG. 3B is a continued schematic diagram of FIG. 3A that shows another part of the configuration of the color resist and the dummy color resist.
Figure 3C:
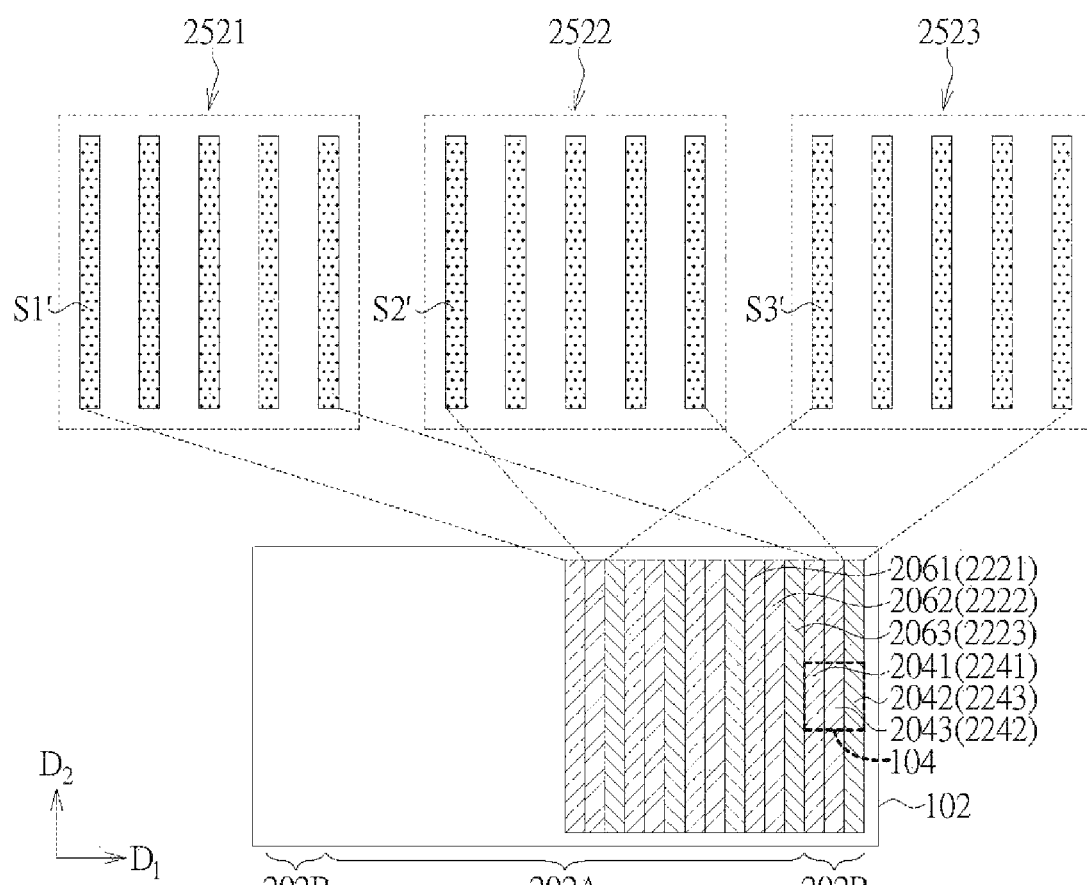
FIG. 3C is a schematic diagram showing that a part of the configuration of the color resist and the dummy color resist in FIG. 2B is configured by using a corresponding photomask.
Figure 3D:
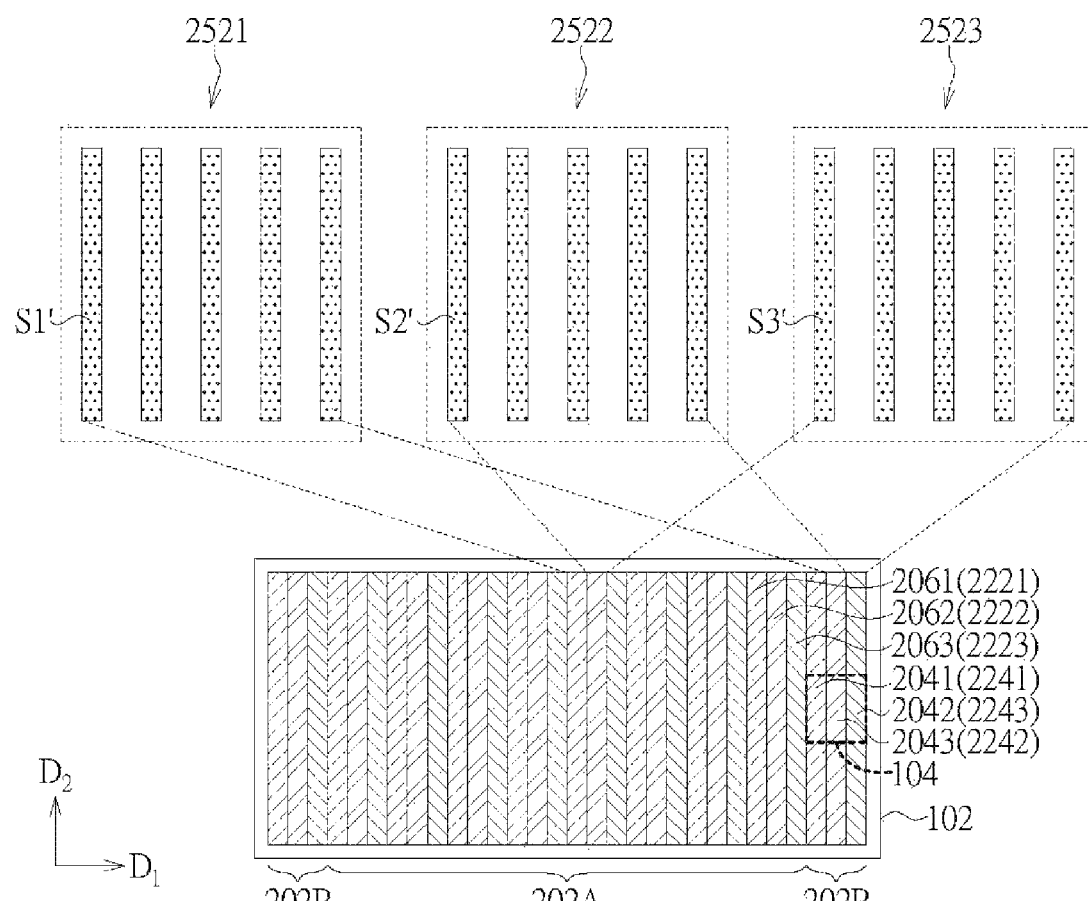
FIG. 3D is a continued schematic diagram of FIG. 3C that shows another part of the configuration of the color resist and the dummy color resist.

Referring to FIG. 3A to FIG. 3D, FIG. 3A is a schematic diagram showing that a part of the configuration of the color resist and the dummy color resist in FIG. 1B is configured by using a corresponding photomask; FIG. 3B is a continued schematic diagram of FIG. 3A that shows another part of the configuration of the color resist and the dummy color resist; FIG. 3C is a schematic diagram showing that a part of the configuration of the color resist and the dummy color resist in FIG. 2B is configured by using a corresponding photomask; and FIG. 3D is a continued schematic diagram of FIG. 3C that shows another part of the configuration of the color resist and the dummy color resist.

Referring to FIG. 3A and FIG. 3B, the first, the second, and the third color resists 1221 to 1223 are disposed on the sub-pixel units 1061, 1062, and 1063 (represented in FIG. 1A and FIG. 1B) in the display area 102A. The dummy color resists 1241 and 1243 are disposed in the first dummy sub-pixel 1041 and the second dummy sub-pixel 1042 in the dummy sub-pixels included in the dummy pixel 104 in the periphery area 102P. In this configuration, the third dummy sub-pixel 1043 in the three dummy sub-pixels included in each dummy pixel 104 does not include, for example, the dummy color resists 1241 and 1243 and the first, the second, and the third color resists 1221 to 1223, and may be located between the first dummy sub-pixel 1041 and the second dummy sub-pixel 1042 in the three dummy sub-pixels included in the dummy pixel 104. Therefore, it may be seen from FIG. 3A and FIG. 3B that a position in an intermediate column of the dummy pixel 104 is vacant and is not provided with a dummy color resist corresponding to the second color resist 1222. According to some embodiments, the first color resist 1221 and the dummy color resist 1241 may be red color resists, the second color resist 1222 may be a green color resist, and the third color resist 1223 and the dummy color resist 1243 may be blue color resists, but the present disclosure is not limited thereto.

As shown in FIG. 3A and FIG. 3B, the first, the second, and the third color resists 1221-1223 and the dummy color resists 1241 and 1243 may be formed by using a successive exposure method for a color filter layer of a display panel. The successive exposure method includes steps of performing more than two times of exposures and developments by using a same photomask, so as to implement patterning of different sizes. As shown in FIG. 3A, after a part of the substrate 102 is exposed by using patterned photomasks (1521, 1522, and 1523) of the color filter layer, the other part of the same substrate 102 is subsequently exposed as shown in FIG. 3B. In this way, an exposure method required for the entire pixel structure substrate 10 is completed. For example, the successive exposure method may be applied to processing a substrate of 41 inches or more or a substrate of 62 inches or more, and may save processing costs, but the present disclosure is not limited thereto. The successive exposure method described herein specifically includes: providing an element layer that is formed with the pixel unit 106 and the like (for example, including at least one signal line, an active element, a drive element, a peripheral drive circuit, and the like); and providing a group of patterned photomasks (1521, 1522, and 1523) that are applied to the color filter layer. The patterned photomasks (1521, 1522, and 1523) of the color filter layer are configured to form the first, the second, and the third color resists 1221 to 1223 and the dummy color resists 1241 and 1243 that are on the pixel structure substrate 10 in FIG. 1A. The patterned photomasks of the color filter layer include a first photomask 1521, a second photomask 1522, and a third photomask 1523. The first photomask 1521 has a plurality of first strip masks S1, and is configured to pattern the first color resist 1221 and the dummy color resist 1241. The second photomask 1522 has a plurality of second strip masks S2, and is configured to pattern the second color resist 1222. The second strip mask S2 is not configured on one side of the second photomask 1522. The third photomask 1523 has a plurality of third strip masks S3, and is configured to pattern the third color resist 1223 and the dummy color resist 1243. A specific patterning manner may be but is not limited to a known manner of patterning the color resists. Because the dummy color resist corresponding to the second color resist 1222 is not disposed, the quantity of the second strip masks S2 of the second photomask 1522 is less than the quantity of the first strip masks S1 of the first photomask 1521 and the quantity of the third strip masks S3 of the third photomask 1523. Using a successive exposure method for exposing twice shown in FIG. 3A and FIG. 3B as an example, the quantity of the second strip masks S2 of the second photomask 1522 may be one less than the quantity of the first strip masks S1 of the first photomask 1521 and the quantity of the third strip masks S3 of the third photomask 1523.

In this embodiment, an example in which a positive photoresist is used for the first, the second, and the third color resists 1221 to 1223 and the dummy color resists 1241 and 1243 is used. Therefore, a part irradiated by a light may have a crack reaction (or namely decompose reaction) and becomes a photoresist having a relatively low crosslinking degree. After a developing process, a photoresist that is not irradiated by the light (for example, a photoresist having a relatively high crosslinking degree) may be reserved, and a photoresist part irradiated by the light (for example, a part having a relatively low crosslinking degree) may be washed away. In another embodiment, an example in which a negative photoresist is used for the first, the second, and the third color resists 1221 to 1223 and the dummy color resists 1241 and 1243 is used. Therefore, a part of a photoresist that is irradiated by a light may have a crosslinking reaction and forms a photoresist having a relatively high crosslinking degree. After a developing process, the photoresist having a relatively high crosslinking degree may be reserved (or namely retained), and a photoresist having a relatively low crosslinking degree may be washed away. Therefore, after the successive exposure steps shown in FIG. 3A and FIG. 3B, there is no color resist between the dummy color resists 1241 and 1243 of the dummy pixel 104 in the periphery area 102P (that is, no color resist is disposed in the third dummy sub-pixel 1043). In a preferred embodiment, the dummy pixel 104 is located on two opposite sides of the display area 102A.

According to some embodiments, the size of each of the first, the second, and the third color resists 1221 to 1223 and the dummy color resists 1241 and 1243 may be substantially equal to that of the corresponding sub-pixel units 1061, 1062, and 1063 or the dummy sub-pixels 1041, 1042, and 1043. For example, as shown in FIG. 3A and FIG. 3B, the width of each of the first, the second, and the third color resists 1221 to 1223 and the dummy color resists 1241 and 1243 may be substantially equal to that of the corresponding sub-pixel units 1061, 1062, and 1063 or the dummy sub-pixels, but the length is a sum of the lengths of several sub-pixel units 1061, 1062, and 1063 or the dummy sub-pixels 1041, 1042, and 1043.

Referring to FIG. 3C and FIG. 3D, FIG. 3C and FIG. 3D show a configuration in a comparative embodiment. The configuration in the comparative embodiment differs from the foregoing exemplary configuration according to the embodiment in that the dummy color resist 2242 that corresponds to the second color resist 2222 is disposed in the third dummy sub-pixel 2043 in the three dummy sub-pixels included in each dummy pixel 104. Therefore, the quantity of second strip masks S2' of a corresponding second photomask 2522 is equal to the quantity of first strip masks S1' of a first photomask 2521 and the quantity of third strip masks S3' of a third photomask 2523. In other words, the quantity of the second strip masks S2 of the second photomask 1522 configured to form the exemplary configuration according to the embodiment is less than the quantity of the second strip masks S2' of the second photomask 2522 configured to form a comparative configuration.

Compared with the configuration in the comparative embodiment, in the exemplary configuration in the embodiment, because the dummy color resist corresponding to the second color resist 1222 is not disposed in the dummy pixel 104, an element, for example, the transfer electrode 134, of the periphery area 102P may be disposed at a position of the third one 1043 in the dummy sub-pixels. In this way, the area of the periphery area 102P may be further decreased, thereby decreasing the sizes of the entire pixel structure substrate and an apparatus using the same, or leaving more space for designing another element, so as to improve spatial elasticity. Meanwhile, the dummy color resist 1243 that is directly adjacent to the display area 102A is still remained. Therefore, the manufacturing uniformity of an element (for example, the pixel electrode) after color filter patterns (the first, the second, and the third color resists) of the display area 202A are formed is not affected.

Figure 4A:
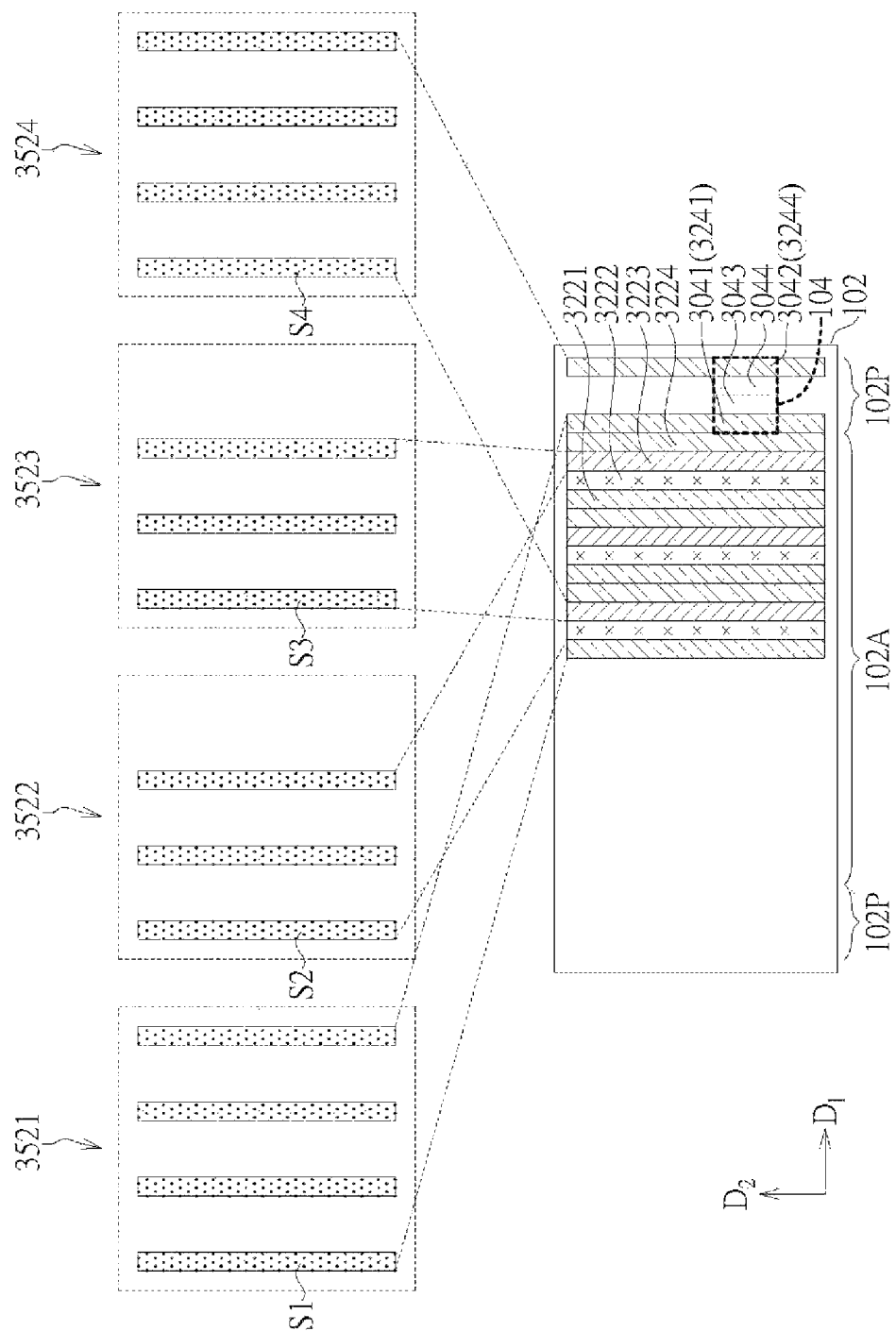
FIG. 4A is a schematic diagram of a part of a configuration of a color resist and a dummy color resist according to another embodiment.
Figure 4B:
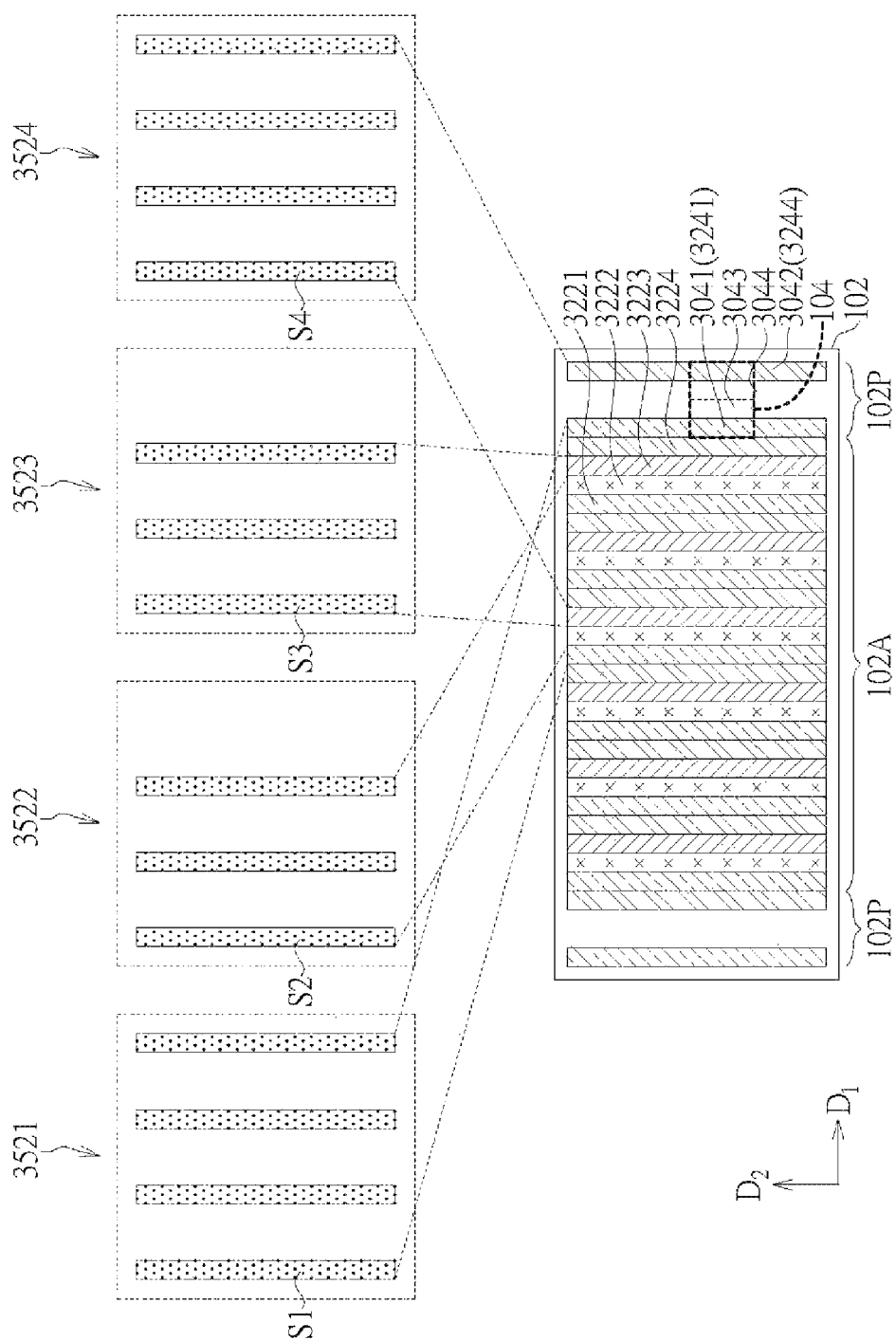
FIG. 4B is a continued schematic diagram of FIG. 4A that shows another part of the configuration of the color resist and the dummy color resist.

Referring to FIG. 4A and FIG. 4B, FIG. 4A is a schematic diagram of a part of a configuration of a color resist and a dummy color resist according to another embodiment; and FIG. 4B is a continued schematic diagram of FIG. 4A that shows another part of the configuration of the color resist and the dummy color resist.

In this configuration, a pixel structure substrate further includes a plurality of fourth color resists 3224 in addition to first color resists 3221, second color resists 3222, and third color resists 3223. The fourth color resists 3224 are disposed on some of pixel units 106. Correspondingly, at least one of dummy pixels 104 (preferably, each dummy pixel) includes at least four dummy sub-pixels. At least two dummy color resists 3241 and 3244 are disposed in a first dummy sub-pixel 3041 and a second dummy sub-pixel 3042 in the at least four dummy sub-pixels included in the dummy pixel 104, and a third dummy sub-pixel 3043 (that is, a third dummy sub-pixel 3043) and a fourth dummy sub-pixel 3044 (that is, a fourth dummy sub-pixel 3044) in the at least four dummy sub-pixels included in the dummy pixel 104 do not include the dummy color resists 3241 and 3244 and the first, the second, the third, and the fourth color resists 3221 to 3224. At least one transfer electrode 134 is disposed in at least one of the third dummy sub-pixel 3043 and the fourth dummy sub-pixel 3044 in the at least four dummy sub-pixels included in at least one dummy pixel 104. At least one drive element T of a peripheral drive circuit 130 is electrically connected to at least one signal line (112, 114, or 116) by using (or namely via) the at least one transfer electrode 134. In this configuration, the third dummy sub-pixel 3043 and the fourth dummy sub-pixel 3044 in the at least four dummy sub-pixels included in at least one dummy pixel 104 are both located between the first dummy sub-pixel 3041 and the second dummy sub-pixel 3042 in the at least four dummy sub-pixels included in the dummy pixel 104. Therefore, it can be seen from FIG. 4A and FIG. 4B that positions in two intermediate columns (that is, the third dummy sub-pixel 3043 and the fourth dummy sub-pixel 3044) of the dummy pixel 104 are vacant, and are not provided with dummy color resists corresponding to the second color resist 3222 and the third color resist 3223. The at least two dummy color resists 3241 and 3244 are in different colors. According to some embodiments, the first color resist 3221 and the dummy color resist 3241 may be red color resists; the second color resist 3222 may be a yellow color resist or a transparent color resist (which may alternatively be referred to as a white color resist); the third color resist 3223 may be a blue color resist; and the fourth color resist 3224 and the dummy color resist 3244 may be green color resists. However, a color correspondence of the color resists is not limited thereto.

As shown in FIG. 4A and FIG. 4B, the first, the second, the third, and the fourth color resists 3221 to 3224 and the dummy color resists 3241 and 3244 may be formed by using a method similar to the foregoing successive exposure method for the color filter layer of the display pane. A group of patterned photomasks of a color filter layer that is applied to the exemplary configuration includes a first photomask 3521, a second photomask 3522, a third photomask 3523, and a fourth photomask 3524. The first photomask 3521 has a plurality of first strip masks S1, and is configured to pattern the first color resist 3221 and the dummy color resist 3241. The second photomask 3522 has a plurality of second strip masks S2, and is configured to pattern the second color resist 3222. The second strip masks S2 are not configured on two opposite sides of the second photomask 3522. The third photomask 3523 has a plurality of third strip masks S3, and is configured to pattern the third color resist 3223. The third strip masks S3 are not configured on two opposite sides of the third photomask 3523. The fourth photomask 3524 has a plurality of fourth strip masks S4, and is configured to pattern the fourth color resist 3224 and the dummy color resist 3244. A specific patterning manner may be, but is not limited to, a known manner of patterning the color resists (or photoresists). The quantity of the second strip masks S2 of the second photomask 3522 and the quantity of the third stripmasks S3 of the third photomask 3523 are less than the quantity of the first strip masks S1 of the first photomask 3521 and the quantity of the fourth strip masks S4 of the fourth photomask 3524. Using a successive exposure method for exposing twice shown in FIG. 4A and FIG. 4B as an example, the quantity of the second strip masks S2 of the second photomask 3522 and the quantity of the third strip masks S3 of the third photomask 3523 may be one less than the quantity of the first strip masks S1 of the first photomask 3521 and the quantity of the fourth strip masks S4 of the fourth photomask 3524. Therefore, the third dummy sub-pixel 3043 and the fourth dummy sub-pixel 3044 may be formed.

Referring to FIG. 5A, FIG. 5A is a schematic diagram of a mask configuration according to still another embodiment. In this embodiment of FIG. 5A, a first substrate 102 further includes a plurality of fourth color resists 5224 in addition to first color resists 5221, second color resists 5222, and third color resists 5223. FIG. 5A differs from FIG. 4A and FIG. 4B in that the first color resist 5221, the second color resist 5222, the third color resist 5223, and the fourth color resist 5224 in FIG. 5A are arranged in a staggered manner (or namely alternately manner) in a first direction D1 and a second direction D2, which is similar to an arrangement manner of a mosaic. A dummy pixel 104 includes at least four dummy sub-pixels. At least two of dummy color resists 5241 to 5244 are disposed in a first dummy sub-pixel 5041 and a second dummy sub-pixel 5042 in the at least four dummy sub-pixels included in the dummy pixel 104, and a third dummy sub-pixel 5043 and a fourth dummy sub-pixel 5044 in the at least four dummy sub-pixels included in the dummy pixel 104 do not include the dummy color resists 5241 to 5244 and the first, the second, the third, and the fourth color resists 5221 to 5224. In this configuration, the dummy sub-pixels may be arranged in at least four columns or rows, but are not limited thereto. At least two dummy color resists corresponding to the dummy sub-pixels in each column or row are in different colors. It can be seen from FIG. 5A that positions in two outer columns of the dummy pixels 104 are vacant, and are not provided with the dummy color resists. For example, in the dummy pixel 104 indicated in FIG. 5A, the first dummy sub-pixel 5041 and the second dummy sub-pixel 5042 in the four dummy sub-pixels respectively include the dummy color resists 5241 and 5242; and the third dummy sub-pixel 5043 and the fourth dummy sub-pixel 5044 in the dummy sub-pixels do not include the dummy color resists 5241 and 5242 and the first, the second, the third, and the fourth color resists 5221 to 5224. In addition, using a column of dummy sub-pixels in the right periphery area 102P that is most adjacent to the display area 102A as an example, the column of dummy sub-pixels includes the dummy color resists 5241 and 5243 that are configured in a staggered manner. At least one transfer electrode 134 is disposed in at least one of the third dummy sub-pixel 5043 and the fourth dummy sub-pixel 5044 in the at least four dummy sub-pixels included in the dummy pixel 104. At least one drive element T of a peripheral drive circuit 130 is electrically connected to at least one signal line (112, 114, or 116) by using (or namely via) the at least one transfer electrode 134. The dummy color resists 5241 to 5244 are in different colors. According to some embodiments, the first color resist 5221 and the dummy color resist 5241 may be red color resists; the second color resist 5222 and the dummy color resist 5242 may be green color resists; the third color resist 5223 and the dummy color resist 5243 may be blue color resists; and the fourth color resist 5224 and the dummy color resist 5244 may be transparent color resists (which may alternatively be referred to as white color resists). Alternatively, the first color resist 5221 and the dummy color resist 5241 may be red color resists; the second color resist 5222 and the dummy color resist 5242 may be green color resists; the third color resist 5223 and the dummy color resist 5243 may be blue color resists; and the fourth color resist 5224 and the dummy color resist 5244 may be yellow color resists. However, the present disclosure is not limited to the color correspondence of the color resists.

The first, the second, the third, and the fourth color resists 5221 to 5224 and the dummy color resists 5241 to 5244 may be formed by using a method similar to the successive exposure method for the color filter layer of the display panel that is described above. A group of patterned photomasks of a color filter layer that is applied to the exemplary configuration includes a first photomask 5521, a second photomask 5522, a third photomask 5523, and a fourth photomask 5524. The first photomask 5521 has a plurality of first strip masks S1, and is configured to pattern the first color resist 5221 and the dummy color resist 5241. The second photomask 5522 has a plurality of second strip masks S2, and is configured to pattern the second color resist 5222 and the dummy color resist 5242. The third photomask 5523 has a plurality of third strip masks S3, and is configured to pattern the third color resist 5223 and the dummy color resist 5243. The fourth photomask 5524 has a plurality of fourth strip masks S4, and is configured to pattern the fourth color resist 5224 and the dummy color resist 5244. A specific patterning manner may be, but is not limited to, a known manner of patterning the color resists. The first, the second, the third, and the fourth strip-shaped masks S1 to S4 are separately and independently arranged in a staggered manner. The first, the second, the third, and the fourth photomasks 5521 to 5524 correspond to these dummy sub-pixels that are vacant (not configured with the color resists and the dummy color resists) in the dummy pixel 104, and may not be separately and independently configured with the strip masks on two opposite sides.

Figure 5B:
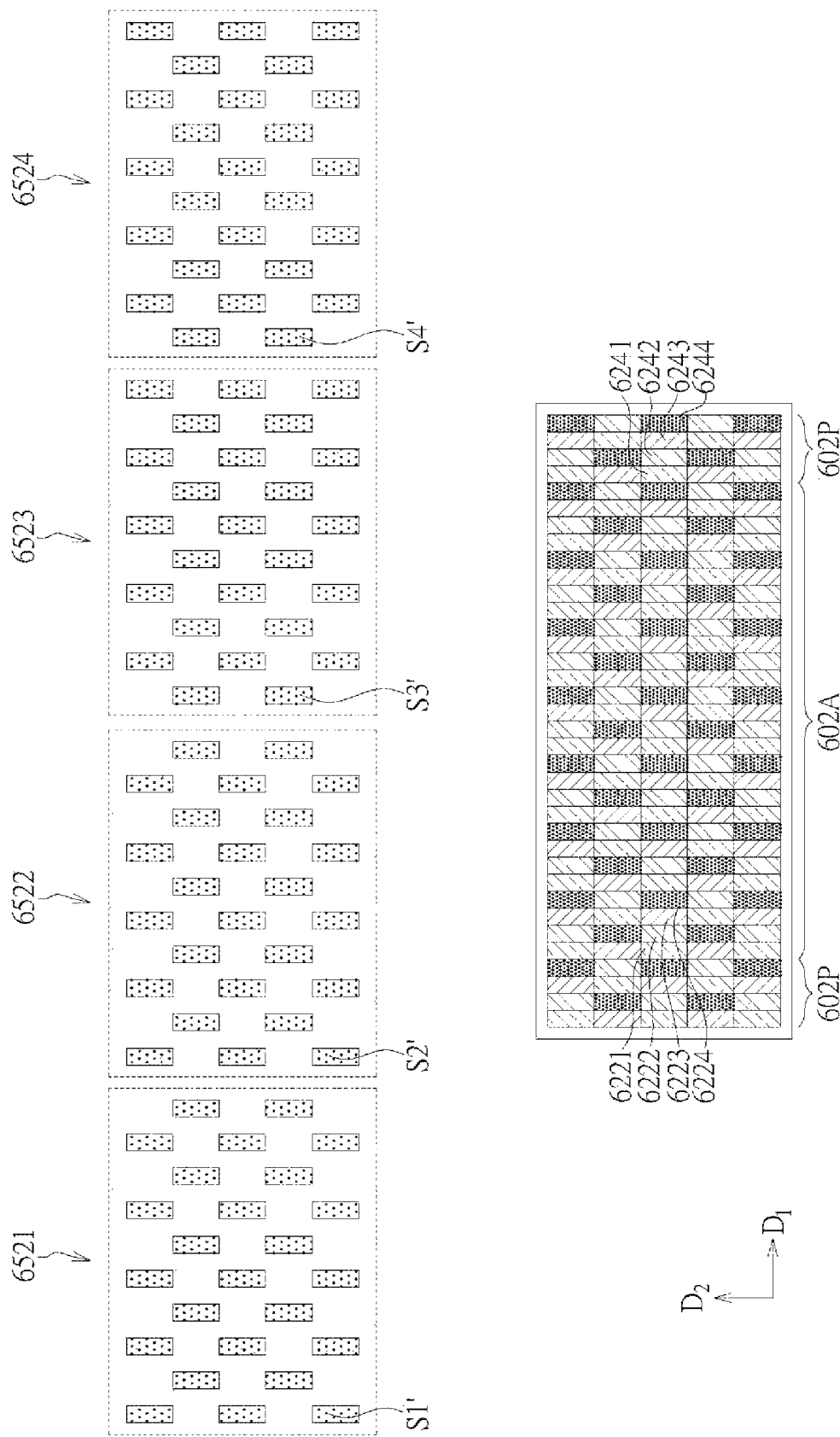
FIG. 5B shows that a corresponding mask configuration is used to manufacture a configuration compared with a configuration of the color resist and the dummy color resist in the embodiment in FIG. 5A.

Referring to FIG. 5B, in this comparative configuration, a display area 602A, a periphery area 602P, first, second, third, and fourth color resists 6221, 6222, 6223, and 6224, and dummy color resists 6241, 6242, 6243, and 6244 are substantially the same as the corresponding elements that are indicated by similar reference numerals in FIG. 5A. The comparative configuration differs from the exemplary configuration according to the embodiment in that the third one and the fourth one in the four dummy sub-pixels included in the dummy pixel 104 are also provided with the dummy color resists (6241 to 6244). Therefore, the quantity of the first, the second, the third, and the fourth strip-shaped masks S1' to S4' of the corresponding first, second, third, and fourth photomasks 6521 to 6524 is more than, for example, two columns more than, the quantity of the first, the second, the third, and the fourth strip-shaped masks S1 to S4 of the first, the second, the third, and the fourth photomasks 5521 to 5524 that are configured to form the exemplary configuration according to the embodiment.

Compared with the comparative configuration, in the exemplary configuration according to the embodiment, because the dummy color resists are not disposed in some of the dummy sub-pixels, another element may be disposed. In this way, the area of the periphery area 102P may be further decreased, thereby decreasing the sizes of the entire pixel structure substrate and an apparatus using the same, or leaving more space for designing another element.

Figure 6:
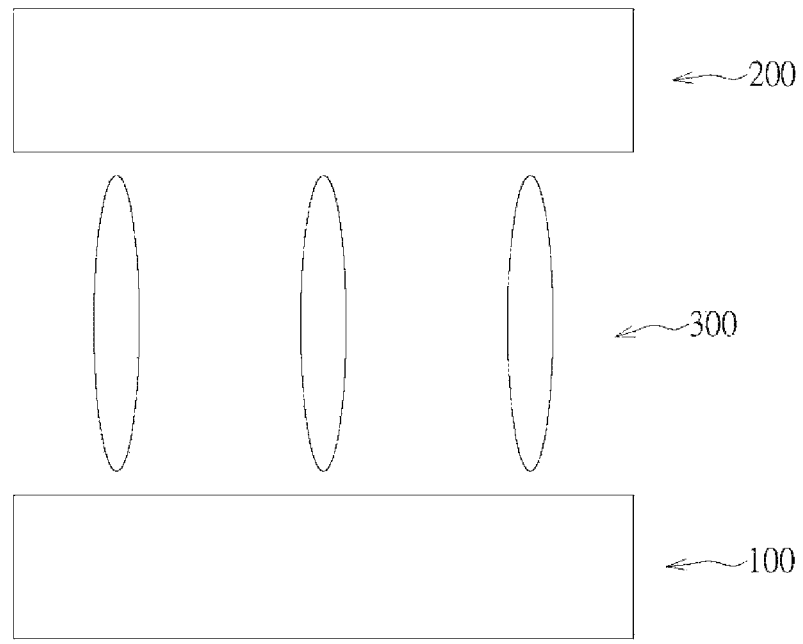
FIG. 6 shows an exemplary display panel according to an embodiment.

A display panel according to the embodiment is described herein. Referring to FIG. 6, FIG. 6 shows an exemplary display panel 1 according to an embodiment. The display panel 1 includes a pixel structure substrate 100, a second substrate 200, and a display medium 300. The pixel structure substrate 100 (including the first substrate 102 stated above), the second substrate 200, and the first substrate 102 herein are disposed opposite to each other. The display medium 300 is disposed between the first substrate 102 and the second substrate 200. The display panel is, for example, the foregoing display panel whose color resist layer (which is alternatively referred to as a color filter layer or a color conversion layer) is configured on an inner surface of the pixel structure substrate 100. The display medium 300 is made of, for example, liquid crystals or another proper non-self luminous material, but the present disclosure is not limited thereto. In another embodiment, the display medium 300 may be made of a self-luminous material, such as an organic material, an inorganic material, or another proper material, or a combination of the foregoing materials; and the color conversion layer (for example, the foregoing color resist layer or another proper color conversion layer) is configured on the inner surface of the pixel structure substrate 100.

Based on the above, the present disclosure is disclosed through the foregoing embodiments; however, these embodiments are not intended to limit the present disclosure. Various changes and modifications may be made by a person of ordinary skill in the art without departing from the spirit and scope of the present disclosure. Therefore, the protection scope of the present disclosure is subject to the appended claims.

What is claimed is:

1. A pixel structure substrate, comprising:
   a first substrate, having a display area and a periphery area, wherein the periphery area is located adjacent to an edge of the display area;
   a first dummy pixel, disposed on the periphery area, comprising a first dummy sub-pixel, a second dummy sub-pixel, and a third dummy sub-pixel;
   a plurality of sub-pixel units, disposed on the display area, wherein each of the sub-pixel units comprises one active element and one pixel electrode, the pixel electrode is electrically connected to the active element, and the active element is electrically connected to one corresponding signal line;
   a plurality of first color resists, disposed on at least some of the sub-pixel units;
   a plurality of second color resists, disposed on at least some of the sub-pixel units;
   a plurality of third color resists, disposed on at least some of the sub-pixel units;
   a peripheral drive circuit, disposed on the periphery area, comprising one drive element;
   a first dummy color resist, disposed in the first dummy sub-pixel;
   a second dummy color resist, disposed in the second dummy sub-pixel, wherein the third dummy sub-pixel of the first dummy pixel does not comprise any dummy color resists; and
   a transfer electrode, disposed in the first dummy pixel, wherein the drive element of the peripheral drive circuit is electrically connected to a first corresponding signal line via the transfer electrode;
   wherein the first color resists, the second color resists, the third color resists are in different colors.

2. The pixel structure substrate according to claim 1, wherein the third dummy sub-pixel in the first dummy pixels is located between the first dummy sub-pixel and the second dummy sub-pixel of the first dummy pixel.

3. The pixel structure substrate according to claim 1, further comprising a plurality of fourth color resists disposed on some of the sub-pixel units;
   wherein the first dummy pixel further comprises a four dummy sub-pixel, and the fourth dummy sub-pixel in the first dummy pixel does not comprise any dummy color resists; and
   wherein the first dummy color resist and the second dummy color resist are in different colors.

4. The pixel structure substrate according to claim 3, wherein the transfer electrode is disposed in one of the third dummy sub-pixel and the fourth dummy sub-pixel.

5. The pixel structure substrate according to claim 4, wherein the third dummy sub-pixel and the fourth dummy sub-pixel in the first dummy pixel are both located between the first dummy sub-pixel and the second dummy sub-pixel of the first dummy pixel.

6. The pixel structure substrate according to claim 3, wherein the first dummy sub-pixel, the second dummy sub-pixel, the third dummy sub-pixel, and the fourth dummy sub-pixel are arranged in four columns.

7. The pixel structure substrate according to claim 6, wherein a first pair of the four columns are located between the display area and a second pair of the four columns; and
   wherein the first pair of the four columns are the third dummy sub-pixel and the fourth dummy sub-pixel in the first dummy pixel.

8. The pixel structure substrate according to claim 1, wherein the one corresponding signal line comprises a data line or a scan line.

9. The pixel structure substrate according to claim 1, further comprising a reference electrode bus-line disposed on the first substrate, wherein the reference electrode bus-line is located between the peripheral drive circuit and the transfer electrode, the reference electrode is electrically connected to a plurality of signal lines, and the reference electrode overlaps with one of the first dummy color resist and the second dummy color resist.

10. A display panel, comprising:
   a first substrate, having a display area and a periphery area, wherein the periphery area is located adjacent to an edge of the display area;
   a first dummy pixel, disposed on the periphery area, comprising a first dummy sub-pixel, a second dummy sub-pixel, and a third dummy sub-pixel;
   a plurality of sub-pixel units, disposed on the display area, wherein each of the sub-pixel units comprises one active element and one pixel electrode, the pixel electrode is electrically connected to the active element, and the active element is electrically connected to one corresponding signal line;
   a plurality of first color resists, disposed on at least some of the sub-pixel units;
   a plurality of second color resists, disposed on at least some of the sub-pixel units;
   a plurality of third color resists, disposed on at least some of the sub-pixel units;
   a peripheral drive circuit, disposed on the periphery area, comprising one drive element;
   a first dummy color resist, disposed in the first dummy sub-pixel;
   a second dummy color resist, disposed in the second dummy sub-pixel, wherein the third dummy sub-pixel of the first dummy pixel does not comprise any dummy color resists;
   a transfer electrode, disposed in the first dummy pixel, wherein the drive element of the peripheral drive circuit is electrically connected to a first corresponding signal line via the transfer electrode;
   a second substrate, disposed corresponding to the first substrate; and
   a display medium, disposed between the first substrate and the second substrate;
   wherein the first color resists, the second color resists, the third color resists are in different colors.

* * * * *